United States Patent [19]

Celler et al.

[11] 4,234,358
[45] Nov. 18, 1980

[54] PATTERNED EPITAXIAL REGROWTH USING OVERLAPPING PULSED IRRADIATION

[75] Inventors: George K. Celler, Lawrenceville; Lionel C. Kimerling, Westfield; Harry J. Leamy, New Providence; John M. Poate, Summit; George A. Rozgonyi, Chatham, all of N.J.

[73] Assignees: Western Electric Company, Inc., New York, N.Y.; Bell Telephone Laboratories, Incorporated, Murray Hill, N.J.

[21] Appl. No.: 27,274

[22] Filed: Apr. 5, 1979

[51] Int. Cl.³ .................. H01L 21/268; H01L 21/26
[52] U.S. Cl. ............................. 148/1.5; 148/175; 148/187; 219/121 L; 250/492 A; 357/91
[58] Field of Search ................. 148/1.5, 187, 175; 357/91; 219/121 L; 250/492 A

[56] References Cited

U.S. PATENT DOCUMENTS

| 3,420,719 | 1/1969 | Dott | 148/188 |
|---|---|---|---|
| 3,585,088 | 6/1971 | Schwuttke et al. | 148/174 |
| 4,133,702 | 1/1979 | Krimmel | 148/1.5 |
| 4,147,563 | 4/1979 | Narayan et al. | 148/1.5 |
| 4,151,008 | 4/1979 | Kirkpatrick | 148/1.5 |
| 4,154,625 | 5/1979 | Golovchenko et al. | 148/1.5 |
| 4,155,779 | 5/1979 | Auston et al. | 148/1.5 |

OTHER PUBLICATIONS

Hutchins, "Localized . . . Diffusion . . . Laser Melting . . .", IBM-TDB, 16, (1974), 2585.
Bertolotti et al., ". . . Amorphous Si . . . Laser Radiation", J. Appl. Phys., 50, (1979), 259.
Greenwald et al., "Pulsed Electron Beam Annealing . . .", J. Appl. Phys., 50, (Feb. 1979), 783.
Bean et al., ". . . Laser-Induced Epitoxy . . .", J. Appl. Phys., 50, (Feb. 1979), 881.
Klimenko et al., ". . . Restoration of Single Xtal Stele . . .", Sov. J. Quant. Electron., 5, (1976), 1289, (English).
Campisano et al., "Laser Reordering . . . GaAs", Solid St. Electronics, 21, (Feb. 1978), 485.
Foti et al., ". . . Laser . . . Self-Implanted Si . . .", Appl. Phys., 15, (1978), 365.
Vitali et al., ". . . Structure . . . Laser Pulses in Si", Phys. Letts., 63A, (1977), 351.

Primary Examiner—L. Dewayne Rutledge
Assistant Examiner—Upendra Roy
Attorney, Agent, or Firm—Samuel H. Dworetsky

[57] ABSTRACT

A technique is described for removing defects and disorder from crystalline layers and the epitaxial regrowth of such layers. The technique involves depositing short term bursts of energy over a limited spatial region of a material thereby annealing the otherwise damaged material and causing it to epitaxially regrow. Subsequent to the short term energy deposition, similar processing is sequentially effected on adjoining and overlapping regions such that a pattern is ultimately "written". This pattern forms a continuous region of essentially single crystal material.

23 Claims, 8 Drawing Figures

PATTERNED EPITAXIAL REGROWTH USING OVERLAPPING PULSED IRRADIATION

BACKGROUND OF THE INVENTION

1. Field of the Invention

This invention involves the removal of defects and disorder from crystalline layers and the epitaxial regrowth of such layers.

2. Description of the Prior Art

In the course of semiconductor device fabrication, starting semiconductor materials are usually "doped" with additional elements to yield the ultimate electrical properties of the desired device. Such addition of appropriate atoms or molecules is effected primarily by one of two broad processes. The first process, referred to as ion implantation, involves bombarding the semiconductor with appropriate, highly energetic dopant ions. The energetic ions enter the material and penetrate to depths as high as one micrometer before their kinetic energy is totally dissipated. In the course of this implantation, the single crystal starting material suffers severe damage to its ordered crystalline structure as a result of the large amount of kinetic energy that is transferred to the host lattice. This damage must be subsequently removed or "annealed" before the desired electrical properties can be realized. This annealing usually proceeds by heating the damaged crystal to temperatures generally in the neighborhood of 1000 degrees C. for material such as silicon. Diffusion occurs more readily in heated material and consequently, both dopant and displaced host atoms can incorporate themselves relatively rapidly (e.g., an hour) into the lattice structure of the single crystal. In addition, dopant atoms may diffuse into the substrate beyond the implanted region. While the annealing process generally eliminates the heavy damage that occurs in the region of initial implantation, some damage may remain in the implanted as opposed to the diffused region. This implanted surface region may be either etched away or the device may be designed such that this residual, post-annealing damage is not detrimental to its operation. Despite the annealing requirement and the occurrence of residual damage, the ion implantation technique is sufficiently powerful to warrant its application in a number of prevalent manufacturing sequences.

The second of the more prevalent doping processes involves the thermal diffusion of dopant atoms from the surface of the semiconductor to its interior. The appropriate dopant constituents may exist as a gas environment in which the semiconductor is placed, or may be deposited directly on the substrate, either prior to or during diffusion. Heating the entire semiconductor crystal results in diffusion of the dopant constituent into the interior region of the material under the influence of the chemical potential gradient which is maintained during the diffusion process. The diffusion may occur in more than one step and, in a prevalent practice, occurs first in a high temperature, predeposition phase and then over a much longer time period in a lower temperature diffusion step. It should be noted that in contradistinction to the ion implantation process, the diffusion process generally results in considerably less damage to the semiconductor substrate. This is due to the low energy dynamics involved in thermal annealing which is inherently less capable of producing damage, and to the fact that any damage which may occur may be essentially simultaneously annealed under the influence of the thermal conditions required for diffusion. However, dislocations due to misfit stresses that arise during cooling may appear during this process.

As mentioned above, the heavy damage which occurs during the ion implantation process must be annealed, generally by exposing the substrate to elevated temperatures. This annealing process is sufficiently powerful so that a surface layer that has been rendered amorphous by ion implantation may be annealed or "regrown" to a single crystal, as a result of the imposition of appropriate thermal conditions and under the influence of an appropriate underlying single crystal substrate. (See, e.g., Csepregi, L., Mayer, J. W., and Sigmon, T. W., *Physics Letters*, 54A, 157 (1975). Similarly, amorphous surface layers produced by vapor deposition of Si atoms onto specially cleaned silicon single crystals may be "regrown" by thermal annealing (Roth, J. A., and Anderson, C. L., *Applied Physics Letters* 31, 689 (1977)). In both cases, however, the regrown material may contain residual defects.

Recently, workers in the field have demonstrated the efficacy of laser radiation as a source of intense thermal energy in the annealing of damaged semiconductor materials. Essentially, the laser is used as a convenient means of depositing energy into the damaged semiconductor material, thereby raising its temperature, and increasing the appropriate diffusion rates so as to permit efficient annealing. (e.g., I. B. Khabullin, et al, *Soviet Physics—Semiconductor* Vol. 11, page 190 (1977)). Both pulsed and cw lasers have been used to obtain limited annealed regions, and a cw laser has been used to scan the damaged semiconductor thereby obtaining a patterned annealed region. (e.g., Kachurin, et al., *Soviet Physics—Semiconductor* 10 1128 (1977)). However, the exact nature of the process involved in laser annealing has not been understood.

Prior applications of the laser have included etching processes using a stationary laser spot, a scanning laser spot, or a series of overlapping laser spots to properly define the etched pattern. (See, e.g., Ready, J. F. (1971) "Effects of High Power Laser Radiation" Academic Press, New York).

SUMMARY OF THE INVENTION

This invention is a technique for removal of defects and disorder from a crystalline layer which adjoins a single crystal material, and for the epitaxial regrowth of such layers. The technique involves exposing discrete regions of the layer to short term energy deposition, usually in the form of laser light, which may render a portion of the layer molten for a limited time, and which anneals any damage which may be present. The point of energy deposition is then translated and additional energy deposition occurs at the new location which overlaps the previously irradiated region. In this manner, sequential translations of the region of energy deposition ultimately result in the formation of a predetermined pattern of annealed material. Applicants have found that despite serious boundary effects which may occur upon single spot annealing, such an overlapping process may result in a continuous annealed pattern of single crystal material. Specifically, applicants disclose that epitaxial regrowth is a prevalent mechanism in laser annealing and that consequently, a continuous annealed pattern of single crystal material may be obtained if the irradiated regions overlap each other sufficiently, and the energy of the pulse as well as the absorptivity of the material are of such values that each region of the layer which is to be annealed is seeded by the adjoining single crystal material, and is thus annealed to an essentially single crystal structure. In an exemplary embodiment, such seeding is effected by melting a disordered semiconductor layer which overlays a single crystal material. Other embodiments include heteroepitaxial growth, alloying and dopant diffusion.

DETAILED DESCRIPTION

Figure 1:
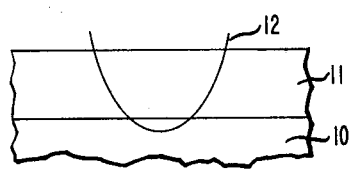
FIGS. 1-4 are schematic representations of annealed semiconductor materials.

The generic laser annealing process, in order to be fully understood and effectively practiced, must be categorized into two separate laser annealing regimes. The first, which is closely analogous to the prior art thermal annealing process, involves the heating of a portion of the damaged semiconductor material by laser irradiation while retaining the solid phase nature of the material. The elevated temperature results in increased diffusion rates and effective annealing, much the same as that which occurs on a much broader spatial scale in the prior art thermal diffusion process. Although this solid phase regime, laser annealing process is thus superficially similar to that of the prior art thermal annealing process, important distinctions exist and should be noted. Diffusion in the solid regime laser annealing process occurs over a much shorter time period than in the prior art thermal diffusion process. In addition, annealing is confined to the region of elevated temperature, which may be controlled laterally by standard optical techniques, and in depth by selection of a laser wavelength and pulse power and period appropriate for the material being processed.

Applicants have disclosed that epitaxial regrowth is a major mechanism involved in laser annealing and that a new regime of annealing is available in the laser annealing process which has little analogy with the prior art diffusion process. In this regime, the semiconductor material is melted under the influence of the deposited laser energy. The diffusion rates in the melt are significantly greater than those in the solid and effective redistribution of the constituent atoms and molecules may occur. After energy deposition ceases, the melt "refreezes" using the adjoining regions of solid single crystal material as a "seed" upon which the pattern for crystallization is based. (Some of this disclosure relating to epitaxial regrowth and the molten regime process is discussed by Celler, et al, *Applied Physics Letters* 32 464 (1978) and Leamy, et al, *Applied Physics Letters* 32, 535 (1978)).

This invention is a technique for defining a patterned region of annealed material. As envisioned, the substrate comprises a single crystal region adjacent to which there exists damaged material. The damaged material, which may be referred to as disordered, may be single crystal material with imperfections such as line, point, and planar defects and precipitates; may be polycrystalline in form; or may be so heavily damaged or disordered so as to fall properly within the "amorphous" category i.e., essentially isotropic and without any long range order. While the practice of the invention will most often occur in conjunction with damaged material which is doped, it might equally well be practiced using undoped material, for example, deposited amorphous or polycrystalline semiconductor material. In either case, the damaged region will be exposed to energy deposition over a finite period of time which will usually extend for periods less than a millisecond or in specific embodiments, less than 10 microseconds. The deposited energy may take any appropriate form, such as, for example, electron beams, ion beams, and incoherent or coherent light beams. All that is necessary is that the energy be deposited in a form which will result in appropriate absorption by the damaged layer. (Layer thicknesses are not limited by any basic phenomenon, but are usually less than 10 microns or in other embodiments, one micron.)

The generic invention lies partly in the realization that energy deposition over a limited spatial region will result in epitaxial regrowth and consequently, in significant edge effects where the desired annealing either does not occur at all, occurs incompletely, or introduces damage of a qualitatively different sort. Applicants teach that extended regions of annealed material may be obtained despite the observed edge effect phenomena by depositing energy sequentially in adjoining spatial regions. Applicants have shown that while the edge effects will predominate when the energy is deposited over a single spatial region, these very same edge effects may be completely avoided if adjoining regions of deposition appropriately overlap each other. To fully appreciate this invention, the nature of the edge effects, as well as a resultant appreciation for the degree of overlap necessary, must be carefully detailed. The following will consist of an extended discussion of these phenomena.

FIG. 1 is a schematic representation of a single region in an exemplary semiconductor material which has been exposed to a single pulse of deposited energy. As discussed above, the energy deposition may occur in two phenomenologically distinct regimes—the solid state regime and the melting regime. However, since the majority of applications will most likely involve the melting regime, the following discussion will be in terms of this phenomenological picture. FIG. 1 is a schematic representation of the effect of annealing on the semiconductor. In this FIG. 10 is a single crystal semiconductor substrate, and 11 is a layer which, in an exemplary embodiment, is disordered, and which is shown overlying the single crystal. The disordered layer may be created by implantation, or deposition, or any other process which results in imperfect crystal structure. In FIG. 1, 12 is a schematic representation of the spatial energy dependence of the energy deposited.

Figure 2:
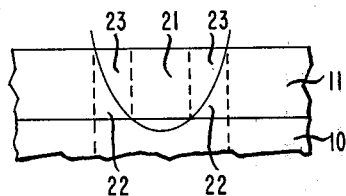

FIG. 2 is a representation the various regions obtained subsequent to annealing of the substrate as in FIG. 1. In FIG. 2, the region 21 is single crystal subsequent to annealing. The region 23 is primarily polycrystalline subsequent to annealing, while the region 22 remains primarily disordered. It is of importance to this invention to understand the nature of the boundary effects shown in FIG. 2 and the reason for their appearance. In the region 21 the deposited energy is sufficient so that the melt front reaches to the underlying single crystal substrate. For example, in the molten regime, part of this single crystal substrate may be rendered molten along with the overlying disordered material. Applicants have shown that the underlying substrate then effectively becomes a "seed" used for the epitaxial regrowth of region 21 after the energy deposition is completed. The region 23, however, while it melts during the annealing process, does not have the benefit of the underlying single crystal for use as a "seed". This is due to the fact that significant energy has not penetrated region 22 or the crystal underlying region 22. So, for example, in the molten regime, region 22 is not rendered molten. However, region 23 does melt, and, in part, since it adjoins region 21 which is rendered single crystal, it is found that region 23 has improved crystallinity subsequent to annealing. However, it may be primarily polycrystalline rather than single crystal.

Figure 3:
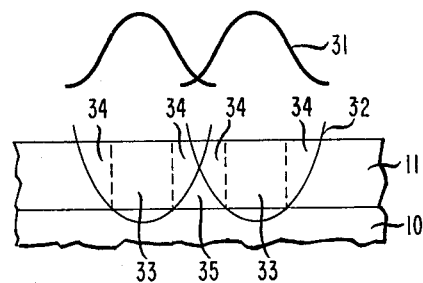

FIG. 3 is a schematic representation of the annealing which occurs when the energy is deposited sequentially in adjoining overlapping regions. In this FIG., 31 is a schematic representation of the energy distribution of the deposited energy. 32 represents the extent to which the melt front has penetrated the substrate. The boundaries of 32 are determined by a number of phenomena that contribute to the transmission properties of the energy through the material. These contributions include the material absorption of the substrate; absorption changes in the substrate due to phase changes, e.g., the substrate becoming molten; absorption effects in the substrate related to the nature and extent of the damage in the material; and absorption effects associated with the nature and magnitude of any dopants present. Consequently, while the distribution of line 32 reflects that of 31, these two quantities, namely, the spatial distribution of the energy deposited and the spatial distribution of its absorption in the material, may be significantly different.

In the representation of FIG. 3, three different regimes will appear subsequent to annealing. Consistent with the discussion above, region 33 will appear as single crystal material. Once again in this embodiment, the melt front in region 33 is sufficient to reach the underlying single crystal material and consequently this material will be used as a "seed" for subsequent epitaxial regrowth in region 33. Region 34, since it is not "seeded" by means of the deposited energy by the underlying crystal does not generally regrow to single crystal. Its juxtaposition to region 33 however, may result in its regrowth to polycrystalline material. Region 35 remains essentially unaffected by the energy deposition. It may be consequently seen that despite the fact that the energy pulses used for deposition in the embodiment of FIG. 3 overlap, the material to be annealed is not transformed to a unitary single crystal layer.

Figure 4:
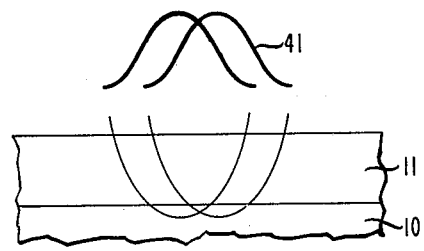

As a result of applicants' discoveries, it has been determined that substantial overlap is required to result in a single crystal layer without intervening imperfections due to the above-described boundary conditions. FIG. 4 is a schematic representation of such an embodiment. In this representation, the energy distribution of the deposited energy 41 is such that energy is deposited throughout damaged region 11, albeit sequentially. In this manner, all parts of region 11 at some point during the annealing "are seeded" by with the underlying single crystal 10 by means of the energy deposition. For example, if the molten regime is obtained, then all parts of the amorphous layer 11 are at some point during the annealing process rendered molten, are seeded by that part of the underlying single crystal material which underlies the amorphous region in question, and regrows epitaxially to a single crystal.

It should be noted that in this case, the regrowth phenomenon involves conflicting seed mechanisms which render the resultant epitaxial regrowth even more unobvious. Specifically, in any given subsequent pulse, both the underlying region which is rendered molten and the adjacent previously annealed region which is rendered molten act as seeds for the newly melted material. Despite this dual and potentially conflicting seeding, applicants find that an essentially single crystal material is obtained.

Figure 5:
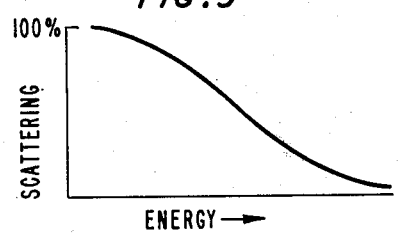
FIGS. 5 and 6 are schematic representations of Rutherford back-scattering data obtained for the material shown in FIGS. 3 and 4.
Figure 6:
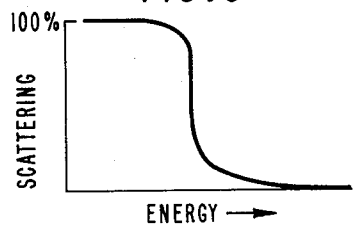

The above understanding of the nature of annealing by means of overlapping energy deposition, was obtained in part by analysis of appropriate Rutherford back-scattering and channeling data shown in FIGS. 5 and 6. FIG. 5 is the data obtained from the embodiment shown in FIG. 3. In FIG. 5, the ordinate is a measure of the back-scattered channeled yield ($X_{min}$). The larger the scattering yield, the greater the disorder in the layer and hence, the more amorphous the layer. In this regard, it should be noted that this technique cannot specifically distinguish between amorphous and polycrystalline material. Rather, single crystal material will yield substantially no channeled back-scattered signal, as displayed on the ordinate, while other material, whether deposited, amorphous or polycrystalline, will yield signals of various magnitude on the ordinate. In FIG. 5, the abscissa is a measure of the energy deposited in each of the pulses shown in FIG. 3. Clearly, when the energy is low, i.e., in the left hand region of FIG. 5, full "communication" between the amorphous and single crystal layer does not obtain and the emorphous layer is not completely annealed thereby resulting in large scattering yield signal in the left hand region of FIG. 5. However, as the energy is increased, the region between the pulses is rendered first polycrystalline and then single crystal as the energy absorption depth increase to yield effective communication between the amorphous layer and the underlying single crystal.

In FIG. 6, the Rutherford back-scattering channeled yield is shown for two pulses which are highly overlapping relative to the embodiment of FIG. 5. In the left hand region of FIG. 6, the pulses were of very low energy and were unable to penetrate through the amorphous layer to the underlying single crystal. Once, however, the pulses reached sufficient energy to penetrate to the underlying single crystal, their high overlap was sufficient to yield a substantially unitary layer of single crystal material. This accounts for the sharp threshold shown in FIG. 6.

Figure 7:
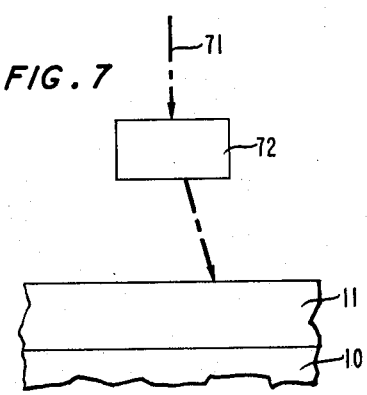
FIG. 7 is a schematic representation of an apparatus used in the practice of this invention.

FIG. 7 is a schematic embodiment of an apparatus used for the practice of this invention. 71 is a source of pulsed energy. This may be any type of energy including electron, ion and neutral beams. In a specific embodiment, 71 will be a pulsed laser. (Dual wavelength annealing may equally well be applied in the practice of this invention, see U.S. patent application Ser. No. 964,193 filed Nov. 23, 1978.) 72 is a means for directing the energy to particular areas on the substrate. After each deposition, the beam will be translated relatively to irradiate a new region of the material while obtaining a sufficient degree of overlap with the previously irradiated region. The nature of the energy, for example, its density, its wavelength, if it is a laser, and the time period over which it is exposed to the material depends both on the exact nature of the energy deposited, as well as on the type of material being annealed, its dopant characteristics and the degree of damage in the layer to be annealed. What is necessary for the practice of this invention is that sufficient energy is deposited to obtain the required seeding of the disordered layer by the underlying single crystal, as described above. (Helpful techniques for monitoring the anneal process are described in U.S. patent application Ser. No. 935,665 filed Aug. 21, 1978.

The above discussion has been in terms of a damaged layer which overlies a single crystal material. It should be appreciated, however, that this configuration is by no means necessary for the effective practice of this invention. All that is necessary is that the material to be annealed during any given laser pulse must adjoin a single crystal material, including material which may have been annealed in a previous pulse. The irradiating pulse must then provide sufficient energy for the single crystal material to act as a seed for the damaged material which is to be annealed. In the molten regime, this implies that the irradiating pulse will melt all of the damaged material at least to the adjoining single crystal material. In some embodiments, when the damaged material has a specifically higher absorption coefficient than the adjacent single crystal material, only the damaged material will be melted, but the single material will nevertheless effectively act as a seed for the subsequent epitaxial regrowth. In other embodiments, where there are significant imperfections at the single crystal damaged material interface, melting of some single crystal along with the damaged material may be desirable.

Figure 8:
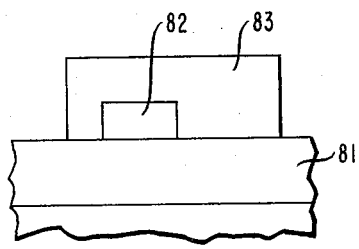
FIG. 8 is a schematic representation of an alternative embodiment of this invention.

While the embodiments which involve a damaged material overlying a single crystal are particularly convenient, other embodiments may find widespread use. Exemplary of these embodiments is the schematic representation of FIG. 8. In this Figure, 81 is a single crystal substrate. 83 is a damaged material to be annealed, while 83 is some other material, for example, an oxide. In this embodiment, as practiced in the exemplary molten regime, the left hand region 82 will be annealed first using the underlying single crystal 81 as a seed. However, subsequent to this, the irradiating pulse will be translated laterally to the right causing the annealing of the damaged material which does not overlie the single crystal 81. During this portion of the annealing, the previously annealed portions of 83 will act as the requisite seed for those portions of 83 which are to be subsequently annealed and which do not overlie the single crystal 81.

Although the previous disclosure has been in terms of single crystal material which is identical to the disordered material, such identity is not necessary for the effective practice of this invention. As is well known in the art, epitaxial growth processes proceed in both the homogeneous epitaxial regime and the heterogeneous epitaxial regime. In the heteroepitaxial region, the single crystal material which acts as a seed for subsequent epitaxial growth is not identical to the material which is ultimately regrown, either in composition or in crystal structure. All that is necessary is that the plane of the single crystal material upon which the epitaxial regrowth proceeds must provide a configurational or structural match to the initial epitaxially grown layers. Allowable configurational mismatch is functionally determined by whether or not single crystal epitaxial growth will proceed. Exemplary of such heterogeneous epitaxial regrowth is the combination of any two members of the group consisting of, for example, germanium, gallium, silicon, gallium arsenide, gallium phosphide or indium phosphide. Additionally, silicon can be grown on sapphire. As properly construed, the invention includes the patterned heterogeneous epitaxial regrowth of such material using overlapping pulse irradiation, as disclosed above.

In addition to simple epitaxial regrowth, it is possible to obtain the epitaxial regrowth of an alloy which combines a number of elements present in the substrate to be regrown, e.g., forming a silicon-germanium alloy from a layer of germanium or silicon. Such alloyed regrowth may result from the interdiffusion of different elemental layers which are present prior to irradiation.

A potentially significant application of interdiffusion during laser annealing involves the formation of an elemental or molecular dopant layer upon the surface which is to be irradiated. Upon irradiation, the elemental layer diffuses into the underlying layer which may or may not be disordered to yield an epitaxially regrown layer which is thusly doped with the appropriate element, i.e., doping silicon with aluminum or boron.

EXAMPLE

Laser iradiation was performed with an acousto-optically Q-switched Nd:YAG laser ($1.064\mu$), operating in a $TEM_{00}$ mode. Typical laser parameters were a 6-kHz repetition rate, a 110-nsec pulse length (FWHM), and a 40-$\mu$m optical spot diameter after focusing, as defined by 1/e light intensity points. Following each pulse the laser beam on the target was moved 8 $\mu$m by means of computer-controlled galvanometer mirrors. A multielement telecentric lens with f/number equal to 24 provided a flat focusing field of 10 cm in diameter. Two prism polarizers external to the laser served as an accurate light attenuator.

Most irradiations were performed on As- and Sb-implanted 1-$\Omega$ cm boron-doped (100) Si, where the top layer of about 1000 A has been made amorphous or highly disordered. Optical microscope pictures of a silicon sample which was implanted with $2.5\times10^{15}$ Sb ions/cm$^2$ at 150 keV, were taken and areas which were amorphous were easy to identify visually because of their milky white appearance. Each laser pulse apparently produced local recrystallization in a small dot of about 25 $\mu$m in diameter, as indicated by the similarity in reflectivity of the laser-irradiated and virgin sample. The peak, incident power density in each spot was 57 MW cm$^{-2}$ and incident energy density about 6 J cm$^{-2}$. In a separate experiment, the laser beam was shifted about 30 $\mu$m between spots in order to prevent overlap. However, even at this larger than usual spot spacing, an increased power density, e.g., 76 MW cm$^{-2}$, resulted in recrystallized spots merging into a single continuous sheet. Perimeter surface ripples were observed and are attributed to laser light interference effects.

We have used the channeling technique with backscattering of 1.8-MeV He to quantitatively investigate the crystallinity of the Si and the lattice site location of the implanted species. Alligned and random yield data were obtained for (100). As implanted into (100) Si at a dose of $8\times10^{15}$ cm$^{-2}$ and energy of 100 keV, and which was subsequently laser irradiated at 67 MW cm$^{-2}$. The implanted As shows no orientation dependence and the Si-aligned yield indicates a completely disordered surface layer some 1500 A thick.

The (100) aligned spectrum for the laser irradiated Si indicates complete recrystallization [$X_{min}^{(100)}$(Si)=3.0%] Moreover, essentially all the arsenic atoms are sitting on substitutional sites, $[X_{min}^{(100)}(As)] = 3.6 \pm 0.3\%$ implies that, at most, only 1% of the As atoms are off lattice sites]. We deliberately ran the channeling measurements for small integrated He doses to avoid the well-known problem of moving As off lattice sites by interaction with the He beam. The average concentration of the As following the laser irradiation corresponds to 1 atomic percent and the appearance of the surface peaks in both the As as well as the Si spectra indicate that the substitutional solid solution extends to the surface.

It should be emphasized that the $^4$He beam spot diameter was 1 mm, so the channeling measurement averaged over some $10^4$ laser spots. We are, however, obtaining channeling data consistent with, if not better than, furnace-annealed As-implanted Si. It appears therefore that the overlapping laser-irradiated spots produce a continuous single-crystal sheet. Detailed TEM studies have shown that these recrystallized areas can be free of line and planar defects. It was not obvious, however, at the start of this work that such overlapping spots could produce large-area single crystal Si.

Another parameter of considerable interest is the depth distribution of As following laser irradiation. As depth distributions were obtained from the back-scattering measurements as a function of laser power. The as-implanted profile was some 800 Å beneath the surface of the sample. Following irradiation with pulses of 38 MW cm$^{-2}$ some movement of the As has occurred but the channeling spectra show high residual damage $[X_{min}^{(100)}(Si) = 47\%]$. Measurable disorder is still present at power levels of 48 MW cm$^{-2}$ $[X_{min}^{(100)}(Si) = 5.1\%]$ but very little at 57 MW cm$^{-2}$ $[X_{min}^{(100)}(Si) = 3.3\%]$. Movement of the As into the Si is clearly seen for power of 67 MW cm$^{-2}$, and at a power of 76 MW cm$^{-2}$ the As has been driven some 5000 Å into the Si.

The high diffusivities implicit in these results tend to rule out a solid-state diffusion mechanism for the As. For example, it can be estimated from standard heat-flow calculations that the time required to dissipate the laser-deposited energy is $\sim 1$ μsec. Motion of 1000 Å in $\sim 1$ μsec requires a diffusivity of about $10^{-4}$ cm$^2$ sec$^{-1}$ which is consistent with diffusion in liquid Si. The highest measured As diffusivities in solid Si are in the range of $10^{-12}$ cm$^2$ sec$^{-1}$ at 1380 degrees C. These As depth profiles, and indeed the observed surface ripples appear more consistent with the concept that the laser pulse melts the Si and the implanted impurities diffuse in the liquid. In this respect, incident photon energy, excitation power, and pulse width, laser spot size, and the distribution and density of the substrate disorder will all play a role in the energy deposition and subsequent heat flow. All these parameters are coupled closely. We note, however, that photon wavelength is not as critical a parameter as might be anticipated since $CO_2$ (10.6 μm) laser irradiation produced good recrystallization of As- and Sb-implanted Si$[X_{min}^{(100)}(Si) \sim 5\%]$. The As and Sb dopants were not as substitutional $[X_{min}^{(100)}(As) \sim 30\%]$ and $X_{min}^{(100)}(Sb) \sim 10\%]$ as for the Nd:YAG irradiation. Moreover, the dopants had been driven into the Si to depths greater than 5000 Å at approximately constant concentration.

Spreading resistance measurements were performed on angle-lapped pieces of As-implanted samples, laser irradiated at 47, 67, and 76 MW cm$^{-2}$. The expected high electrical activity of the resulting substitutional As were observed. The measured junction depths increase with laser power and are roughly coincident with the end of the observed distribution.

We claim:

1. A method comprising
   irradiating a first region of material, which adjoins a single crystal material, with a pulse of energy which is absorbed at least in part by the material; and
   irradiating subsequently a second region of material adjacent to the first region; the invention characterized in that the irradiated regions overlap each other sufficiently, and the energy of the irradiating pulse and the absorptivity of the irradiated material are of such values that each region of the material which is irradiated is seeded by adjacent single crystal material and is epitaxially regrown to an essentially single crystal structure, thereby defining an essentially continuous single crystal pattern.

2. The method of claim 1 wherein at least a portion of the irradiated material is disordered.

3. The method of claim 2 wherein the disordered material is rendered molten upon irradiation.

4. The method of claims 1 or 2 wherein the disordered material and a portion of the adjacent single crystal material is rendered molten upon irradiation, and regrows to an essentially single crystal by liquid epitaxial regrowth.

5. The method of claim 3 wherein the disordered material and a portion of the adjacent single crystal material is rendered molten upon irradiation, and regrows to an essentially single crystal by liquid epitaxial regrowth.

6. The method of claim 2 wherein the disordered material is disordered during ion implantation.

7. The method of claim 6 wherein the disordered material and a portion of the adjacent single crystal material is rendered molten upon irradiation, and regrows to an essentially single crystal by liquid epitaxial regrowth.

8. The method of claim 2 wherein the disordered layer is amorphous.

9. The method of claim 8 wherein amorphous layer is deposited.

10. The method of claim 2 wherein the disordered layer is polycrystalline.

11. The method of claim 3 wherein at least part of the irradiated material is semiconductor material.

12. The method of claim 11 wherein the semiconductor material is selected from the group consisting of silicon, germanium, gallium arsenide, and gallium phosphide.

13. The method of claim 11 wherein the disordered material differs in either composition or crystal configuration from the adjacent single crystal material, and heteroopitaxially regrows upon irradiation.

14. The method of claim 13 wherein the disordered material is silicon and the single crystal material is sapphire.

15. The method of claim 1 wherein the irradiated material comprises a dopant material which diffuses through at least part of the underlying material, and the underlying material, upon annealing, regrows to an essentially single crystal material doped with the dopant.

16. The method of claim 15 wherein prior to irradiation at least part of the material underlying the dopant layer is disordered.

17. The method of claim 15 wherein prior to irradiation essentially all of the material underlying the dopant layer is single crystal.

18. The method of claim 1 wherein the irradiated material includes a layer of material capable of alloying with the underlying material and at least a portion of which upon irradiation combines with the underlying material to form an essentially single crystal alloy.

19. The method of claims 1, 2, 5, 8, 11, 13, 15 or 18 wherein the irradiating energy is selected from the group consisting of an ion beam, and electron beam, as incoherent light beam, and a laser beam.

20. The method of claim 19 wherein the irradiating energy is a pulsed laser beam.

21. The method of claim 20 wherein the pulse period is less than one millisecond.

22. The method of claim 21 wherein the pulse period is less than one microsecond.

23. The method of claim 22 wherein the pulse period is less than one nanosecond.

* * * * *